United States Patent [19]

Takaoka et al.

[11] 4,210,828
[45] Jul. 1, 1980

[54] DEVICE FOR IMPROVING OUTPUT WAVEFORM OF MANUALLY CONTROLLABLE PULSE GENERATOR FOR USE IN PRESET ELECTRONIC TUNING CONTROL DEVICE

[75] Inventors: Saburo Takaoka; Youichiro Tsuda, both of Tokarozawa, Japan

[73] Assignee: Pioneer Electronic Corporation, Tokyo, Japan

[21] Appl. No.: 912,143

[22] Filed: Jun. 2, 1978

[30] Foreign Application Priority Data

Jun. 3, 1977 [JP] Japan .................................. 52-66067

[51] Int. Cl.² ............................................. H03K 5/153
[52] U.S. Cl. .................................... 307/268; 307/290; 307/350

[58] Field of Search ............... 307/268, 290, 350, 354; 328/28, 31

[56] References Cited

U.S. PATENT DOCUMENTS

| 3,604,945 | 9/1971 | Hoffman et al. ................. 307/290 X |
| 3,621,452 | 11/1971 | Ho .................................... 307/290 X |

Primary Examiner—John Zazworsky
Attorney, Agent, or Firm—Sughrue, Rothwell, Mion, Zinn and Macpeak

[57] ABSTRACT

An output waveform of a manually operable tuning pulse generator of an electronic preset type tuning control device of a tuner using varactor diodes for a multiband radio receiver is improved by using Schmitt trigger circuit means which may be provided with a trigger level checking circuit, both being provided as IC.

3 Claims, 4 Drawing Figures

DEVICE FOR IMPROVING OUTPUT WAVEFORM OF MANUALLY CONTROLLABLE PULSE GENERATOR FOR USE IN PRESET ELECTRONIC TUNING CONTROL DEVICE

BACKGROUND OF THE INVENTION

This invention relates to a multi-band radio receiver and, more particularly, to an electronic tuning device for the multi-band receiver, in which the bands and the channels can be preset digitally.

Such radio receivers have been improved in various manners according to recent developments of electronic engineering and one such result is disclosed in Japanese Utility Model Application No. 11353/1975 in which a preset type multi-band receiver has a varactor diode tuner and a control therefor. The control comprises a channel selector switch means, a memory to be addressed by outputs of the channel selector switch, an up-down counter to be set by a manual pulse generator signal or a channel signal read out from the preset memory address and a digital-analog converter for converting an output of the counter into an analog signal which is supplied to the variable capacitor (Varactor) diode which forms a tuning circuit responsive to the analog signal for tuning the receiver to a desired signal in the preset channel.

In this case, the channel selector switch means is composed of a plurality of non-lock type switches. The up-down counter is controlled by the output of the memory every time a channel selector signal from any one of the channel selector switches is detected. For a multi-band receiver, at least a band selector switch may be connected to the channel selector switches in series therewith.

In this case, however, since the output of the channel selector switch is different from that of the band selector switch in the standby state, that is, all of contacts of the channel selector switch are in off-state or low state, while the band selector switch is on except for instances of band selection between the adjacent bands. Therefore, in order to detect the outputs of both of the switches having different standby states, at least two kinds of circuits are necessary.

Further, although this type electronic tuner allows a relatively large number of preset data to be set reliably, the channel selection becomes relatively complicated because the memory supplies the information to the up-down counter according to the output of the channel selector switch. In other words, assuming, for example, that the channel is to be changed from channel number 3 in A band to channel number 3 in B band, that is, when the channel is changed from a certain channel number in one band to the same channel number in another band, it is necessary to operate the channel selector switch contact corresponding to channel 3 again after the band selector switch is switched from A to B.

In order to improve the tuner to eliminate these defects, a device such as shown in FIG. 1 has been proposed.

In FIG. 1, a pulse generator 1 has a pair of output terminals at one of which tuning pulses U/D are produced manually and at the other of which clock pulses KC are generated. The tuning pulses are either up count pulses U or down count pulses D, depending on the direction of the manual operation of the generator. The output terminals of the pulse generator 1 are connected to a binary up/down counter 2 which counts up or down the clock pulses KC depending on whether up or down are received from the pulse generator 1. A portion of an output of the U/D counter 2 is fed to a frequency indicator 3 which is, in this embodiment, a digital indicator.

The frequency indicator 3 provides an indication of the selected frequency by using some most significant bits of the parallel count output of the U/D counter 2. The output of the U/D counter 2 is also fed to an input of a pulse synthesizer 4 which, according to the output of the U/D counter, provides a serial pulse train including a predetermined number of pulses corresponding to the output of the U/D counter 2. The output of the pulse synthesizer 4 is fed to a low pass filter 5. The low pass filter 5 and the pulse synthesizer 4 constitute a digital-analog converter. A contact d of a first band selector switch 6 is connected to an output of the low pass filter 5. The band selector switch 6 has three contacts a, b and c, in this embodiment, which are connected to varactor diodes in tuning circuits for bands A, B and C, respectively.

A channel selector switch means 7 has a plurality of non-lock type switches 7a to 7e. One side of each of the switches 7a to 7e is connected to a common voltage source, +V.

A second band selector switch 8 is ganged with the band selector switch 6 and a contact arm d thereof is connected to the common connection of the switches 7a to 7e.

A random access read/write memory (RAM) system 9 comprises a channel memory 19 having inputs connected to the channel selector switches 7a to 7e, respectively, an address decoder 20 having inputs connected to outputs of the channel memory 19 and inputs connected to the contacts a, b, c of the band selector switch 8, and a RAM 21 having inputs connected to outputs of the address decoder 20 which latches the outputs of these switches so that, according to the outputs of the latter, the output of the up-down counter 2 is stored in an assigned address of the RAM and then read out therefrom and fed to the counter 2.

A controller circuit 10 has an input connected to one side of a preset switch 11 the other side of which is connected to the common connection of the channel selector switch means 7 and other band selector switch 8. The function of the control circuit 10 is to supply a load signal L to the U/D counter 2 when the preset switch 11 is off and an output is provided by any one of the channel selector switches 7a to 7e and to supply a write signal W to the RAM 21 when the preset switch 11 is on. The control circuit 10 may take various forms and comprises a controller, a band switch detector and a load pulse generator. The controller has an input connected to the preset switch 11 and a plurality of inputs connected to the other sides of the switches 7a to 7e. The band switch detector has its inputs connected to the contacts a, b and c of the switch 8, respectively. The load pulse generator 15 has an input connected to an output of the band switch detector 14. The controller provides a load signal output L and a write signal output W to the U/D counter and the RAM 9, respectively.

In manual operation when one operates the pulse generator 1 in one direction to generate the up-pulses U, for example, the latter is supplied to the U/D counter 2 causing it to count up the clock pulses KC from the pulse generator 1. The parallel outputs of the U/D counter 2 are coupled to the stages of the pulse synthesizer 4, respectively. Stages of the pulse synthesizer 4 are capable of providing different frequency signals, which may be produced by frequency-dividing an oscillation frequency signal by different divisors, respectively, according to the parallel outputs of the U/D counter 2. The synthesizer 4 synthesizes different frequency signals produced by the stages thereof according to the output of the U/D counter to produce a serial pulse train containing pulses the number of which corresponds to the output of the U/D counter. The serial pulse train from the pulse synthesizer 4 is fed to the low pass filter 5 to remove high frequency components thereof and produce a dc voltage signal corresponding to the output of the U/D counter 2. The dc voltage signal is fed to a varactor diode of one of tuning circuits (not shown) which was selected by the band selector switch 6 to obtain a tuning at the corresponding frequency.

A suitable number of most significant bits of the output of the U/D counter 2 are fed to the frequency indicator 3 to visually and digitally indicate the frequency being received.

In preset operation, it is assumed that a desired channel in a desired band has been selected in the manner described above.

By turning the preset switch 11 on and then turning any selected one of the channel selector switches 7a to 7e on, a write signal W is generated in the control circuit 10 and fed to the RAM 21, so that the count output of the U/D counter 2, i.e., a digital signal corresponding to the tuned frequency being received, can be stored in an address of the RAM 21 assigned by the band selector switch 8, and the selected one of the switches 7a to 7e being on. Thus, certain channels in certain bands can be preset in the RAM, individually.

A certain channel in a certain band which is thus preset is selected by selecting the contact of the band selector switch and the channel selector switch corresponding thereto. Since, at the selection of the band selector contact and the band selector switch the preset switch 11 is off, the control circuit 10 supplies the band signal L to the U/D counter. As a result, the parallel readout signal from the RAM 21 which, receives the outputs from the band selector switch 8 and the channel selector switch 7 as an address to be readout, is fed to the U/D counter 2.

The U/D counter 2 provides an output, as mentioned before, which is fed to the pulse synthesizer 4, in the same manner as in the manual operation.

The change in channel in the same band can be performed by merely selecting a desired channel selective switch to be on.

When only the band is to be changed while the channel number is fixed, it is sufficient to switch the contact of the band selector switch 8 to a desired band.

As for the pulse generator, it should be of a type which is simple in construction and manually controllable. In order to satisfy these requirements, the pulse generator may be mechanical and comprise a rotary disc supported by a shaft having a free end equipped with a knob member. The disc has a plurality of equally spaced through-holes or slits arranged along the peripheral portion thereof. At least one light emitting element is disposed on one side of the disc and at least a light receiving element is arranged on the other side of the disc so that the light emitted from the light emitting element can be received by the light receiving element through the slits. By turning the knob in one or the other direction, the light to be received by the light receiving element becomes intermittent, so that the latter element provides a series of pulses the number of which corresponds to the angle of the rotation of the disc. This pulse generator is successive in one sense. However, the output pulse waveform of the light receiving element depends upon the rotation speed of the knob and is not rectangular but sinusoidal, causing the digital handling of the output pulse to be difficult. Furthermore, although the number of pulse outputs should be large enough to obtain correspondencies to a number of data, it is difficult to increase the number of the slits due to the available space. Further, due to undesirable reflection and/or leakage of the light, the S/N ratio is degraded causing the channel selection to be unstable.

SUMMARY OF THE INVENTION

An object of the present invention is to improve the output waveform of the pulse generator.

Another object of the present invention is to improve the waveform with a simple device capable of being incorporated in an integrated circuit.

A further object of the present invention is to provide a checking circuit for the device, which is easily incorporated in the integrated circuit.

DETAILED DESCRIPTION OF THE EMBODIMENTS

Figure 2:
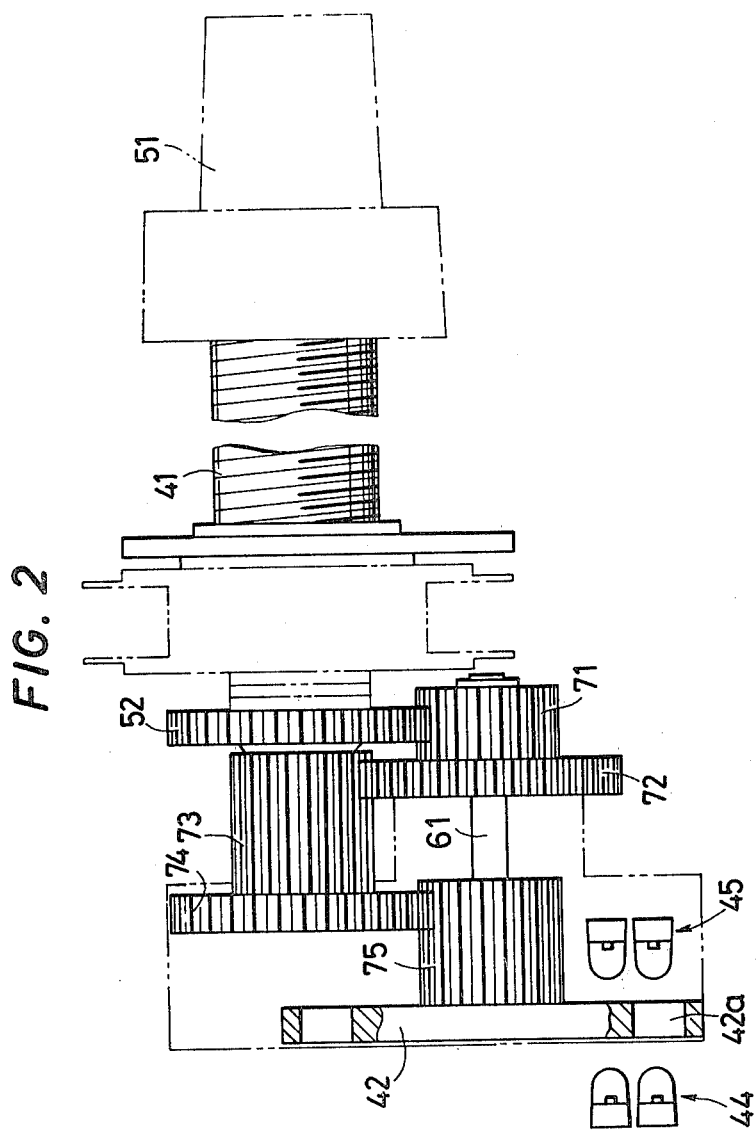
FIG. 2 is a manually controllable pulse generator of the present invention to be used in the control device in FIG. 1.

In FIG. 2, a pair of light receiving elements 44 are disposed on one side of a disc 42 having formed along the periphery thereof a plurality of equally spaced slits 42a. A corresponding pair of light emitting elements 45 are disposed in the other side of the disc 42 such that the elements 44 can receive lights from the elements through the slits 42a, respectively. The two sets of elements are to facilitate distinguishing the rotating direction of the disc. In order to improve the waveform of the pulses obtainable from the light receiving elements to thereby make it suitable to be handled in the digital circuit, rectangular, for example, the slit 42a is tapered.

With this taper, the light emitted from the light emitting elements 45 is collimated and falls on the light receiving element 44 with sharp edges.

The disc 42 is supported by a shaft 61 to which a gear 75 is fixedly secured. On the shaft 61, a gear 71 and a gear 72, integral with the gear 71 are rotatably mounted as shown. A gear 74 having a larger number of meshes than the gear 75 meshes with the latter. A gear 73 is provided integrally with the gear 74. The gear 73 meshes with the gear 72. The gear 71 meshes with a gear 52 which is fixedly secured to a shaft 41. A knob 51 is fixed to one end of the shaft 41.

The gears 52, 71, 72, 73, 74 and 75 form a speedup gear mechanism for increasing the number of obtainable from the light receiving elements 44 by the manual rotation of the knob 41.

With this speedup gear mechanism, the number of output pulses is much increased without increasing the number of the slits, resulting in an improvement of the output waveform. It is advisable to make each of the slits 42a of the disc 42 tapered so that the area thereof at the light inlet side is somewhat larger than that at the light outlet side. With this tapered structure of the slit, the light passing therethrough is well collimated and the output from the light receiving element becomes sharply edged.

Although this mechanism is effective in improving the output waveform as mentioned, the waveform is not always in the correct rectangular form.

Figure 3:
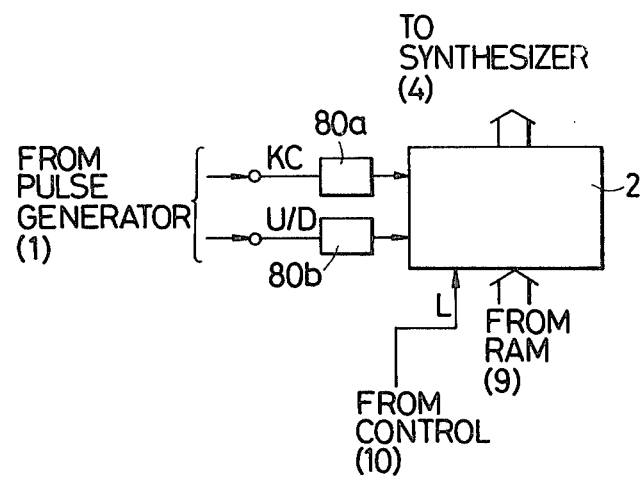
FIG. 3 is a block circuit of the present invention wave shaping device when inserted between the pulse generator and the up/down counter in FIG. 1.

In order to further improve the waveform of the pulse outputs of the pulse generator, according to the present invention, a Schmitt trigger circuit means is connected between the output terminals of the pulse generator 1 and the up/down counter 2 as shown in FIG. 3. By using the Schmitt trigger circuits 80a and 80b, the output pulses from the pulse generator 1 become rectangular which is the most suitable form for digital treatment thereof.

Figure 1:
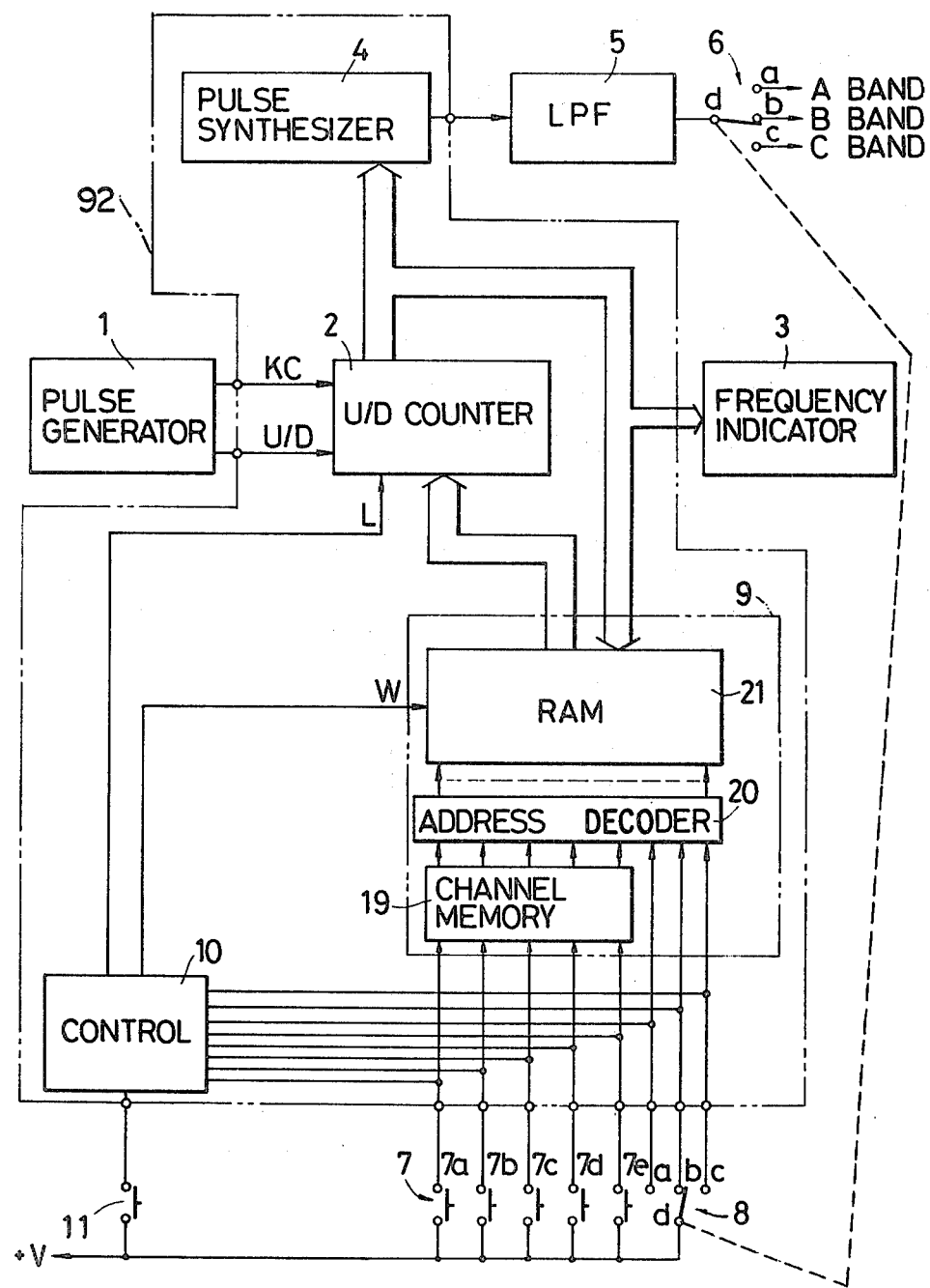
FIG. 1 is a schematic block circuit diagram of the conventional preset type electronic tuning control device which was described already.

The control device according to the present invention may be constructed as an integrated circuit (IC). The portion of it shown by the double-dash line 92 in FIG. 1 may be provided as an integrated circuit. That is, the control device, except the pulse generator 1, the low pass filter 5, the frequency indicator 3, the band selector switches 6 and 8, the channel selector switches 7a to 7e and the preset switch 11, is suitably provided as an IC.

When ICed, the provision of the Schmitt trigger circuits 80a and 80b provide another problem. That is, the trigger level of the Schmitt trigger circuits 80a and 80b have to be checked at least at the preparation of the device. In order to check the trigger levels, it is necessary to provide check terminals at the output sides of the Schmitt circuits 80a and 80b.

Since, in IC, the number of terminals (pins) is limited, it is undesirable to use terminals of the IC for such purpose. Therefore, it is highly desired to minimize the number of the terminals used for checking the Schmitt trigger circuits 80a and 80b.

Figure 4:
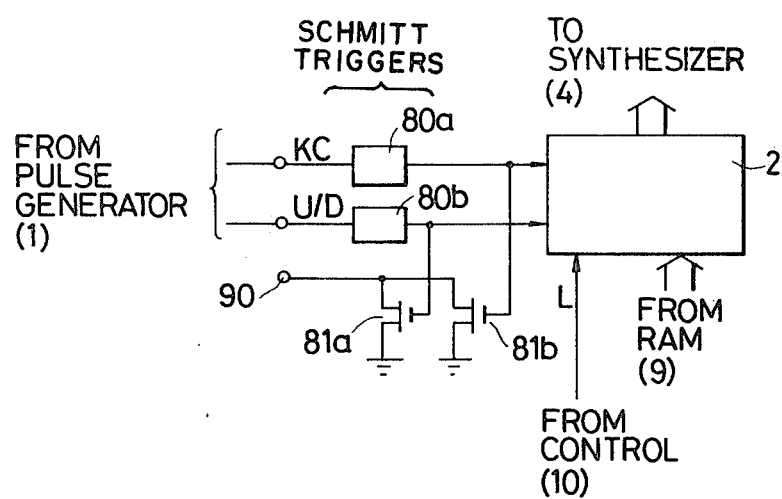
FIG. 4 is a check circuit for the wave shaping device in FIG. 3.

FIG. 4 shows an embodiment of the checking circuit which needs only one terminal. The checking circuit comprises a pair of switching elements 81a and 81b, such as N channel open drain MOS transistors. The transistor 81a has a drain connected to a check terminal 90, a grounded source and a base connected to an output of the Schmitt trigger circuit 80b, and the transistor 81b has a drain connected to the check terminal 90, a grounded source and a base connected to an output of the Schmitt trigger circuit 80a.

As is well known, the Schmitt trigger circuits 80a and 80b function to change the shape of the substantially sinusoidal output waveform from the rectangular pulse generator 1 to a pulse waveform with a given threshold level. Therefore, it is necessary to check the threshold levels of the Schmitt triggers with respect to the output of pulse generator 1.

In checking the Schmitt trigger circuits, the checking terminal 90 is connected through a protective resistor (not shown) to a plus terminal of a power supply. In this condition, the voltage is applied to the input of the Schmitt trigger 80a and is changed gradually. And a variation of the voltage at the checking terminal 90, which is due to the on-off operation of the transistor 81b, is checked. The value of the voltage supplied to the Schmitt trigger 80a at the change in the voltage at the checking terminal is the threshold level. The threshold level of the Schmitt trigger 80b is checked in the same manner.

With this checking circuit, the number of IC terminals used for checking is only one, even if the number of the Schmitt trigger circuits is increased. Further since the output of the checking portion is received by the switching element 81a or 81b and is detected at the checking terminal 90, there is no effect on the input signal to the up/down counter 2. It should be noted that the sources of the switching elements 81a and 81b may be connected to another terminal of the IC, e.g., a reset terminal thereof. In the latter case, there is no need of providing the checking terminal because the reset terminal can be used concurrently as the checking terminal.

What is claimed is:

1. In a preset type electronic tuning control device having a manually operable pulse generator and an up/down counter having inputs connected to at least two outputs of said pulse generator, a device for improving the output waveforms of said pulse generator and comprising a first Schmitt trigger circuit connected to one of said outputs of said pulse generator and a second Schmitt trigger circuit connected to the other output of said pulse generator, and further comprising threshold level checking means for checking the threshold levels of said first and second Schmitt trigger circuits.

2. The device for improving output waveforms as claimed in claim 1, wherein said threshold level checking means comprises a first switching means responsive to an output of said first Schmitt trigger circuit to provide an output indicative of the threshold level of said first Schmitt trigger circuit and a second switching means responsive to an output of said second Schmitt trigger circuit to provide an output indicative of the threshold level of said second Schmitt trigger level, said outputs of said first and second switching means being connected to a common connection, and a single threshold level check terminal means connected to said common connection for providing indications of the threshold levels of both of said Schmitt trigger circuits.

3. The device as claimed in claim 2 wherein said device is an integrated circuit, and wherein said terminal means is a terminal of said integrated circuit.

* * * * *